(12) United States Patent
Kurihara et al.

(10) Patent No.: US 7,661,841 B2
(45) Date of Patent: Feb. 16, 2010

(54) ILLUMINATION DEVICE AND DISPLAY DEVICE PROVIDED WITH THE SAME

(75) Inventors: Matoko Kurihara, Chiba (JP); Kazuya Kato, Chiba (JP)

(73) Assignee: Seiko Instruments Inc. (JP)

( * ) Notice: Subject to any disclaimer, the term of this patent is extended or adjusted under 35 U.S.C. 154(b) by 245 days.

(21) Appl. No.: 11/521,044

(22) Filed: Sep. 14, 2006

(65) Prior Publication Data
US 2007/0057626 A1 Mar. 15, 2007

(30) Foreign Application Priority Data

| Sep. 15, 2005 | (JP) | ............................. 2005-268517 |
| Dec. 9, 2005 | (JP) | ............................. 2005-355736 |
| Feb. 7, 2006 | (JP) | ............................. 2006-029856 |
| Jul. 24, 2006 | (JP) | ............................. 2006-200347 |

(51) Int. Cl.
*F21V 9/00* (2006.01)

(52) U.S. Cl. ................. 362/231; 362/278; 362/561; 362/610; 362/612; 362/615; 362/617; 313/113; 313/467; 313/487; 313/498; 313/501; 313/503

(58) Field of Classification Search ............. 362/231, 362/278, 561, 610, 612, 615, 617; 313/467, 313/503, 113, 487, 498, 501
See application file for complete search history.

(56) References Cited

U.S. PATENT DOCUMENTS 6,637,905 B1 * 10/2003 Ng et al. ................. 362/601

| 2003/0020101 | A1 * | 1/2003 | Bogner et al. ............... 257/233 |
| 2003/0042845 | A1 * | 3/2003 | Pires et al. ................. 313/501 |
| 2003/0063106 | A1 * | 4/2003 | Starkweather .............. 345/690 |
| 2003/0228412 | A1 * | 12/2003 | Chen ........................... 427/157 |
| 2005/0185117 | A1 * | 8/2005 | Kashima ...................... 349/97 |
| 2006/0001036 | A1 * | 1/2006 | Jacob et al. .................. 257/98 |
| 2006/0001037 | A1 * | 1/2006 | Schardt et al. ............... 257/98 |

FOREIGN PATENT DOCUMENTS

| JP | 11109326 A | * | 4/1999 |
| JP | 2008010556 A | * | 1/2008 |

* cited by examiner

*Primary Examiner*—Sharon E Payne
*Assistant Examiner*—Mary Zettl
(74) *Attorney, Agent, or Firm*—Adams & Wilks

(57) ABSTRACT

An illumination device has a blue light emitting element that emits blue light and a light guide member that guides blue light emitted from the blue light emitting element to a light exit surface of the light guide member. A first color conversion element includes a red phosphor that emits red light in response to excitation with the blue light. The first color conversion element is disposed on an optical path between the blue light emitting element and the light guide member. A second color conversion element is disposed on a light exit surface side of the light guide member and separated from the first color conversion element. The second color conversion element comprises a pair of non-permeable transparent substrates, a resin disposed between the non-permeable transparent substrates, and a green phosphor dispersed in the resin for emitting green light in response to excitation with the blue light.

22 Claims, 6 Drawing Sheets

WAVELENGTH DISTRIBUTION

CF FOR CONVENTIONAL LED
+ CONVENTIONAL LED

CF FOR CONVENTIONAL LED
+ PRESENT INVENTION LED

ILLUMINATION DEVICE AND DISPLAY DEVICE PROVIDED WITH THE SAME

BACKGROUND OF THE INVENTION

1. Field of the Invention

The present invention relates to an illumination device for illuminating a non-self light emission display element and a display device which is provided with the illumination device and used for an electronic device. In particular, the present invention relates to a liquid crystal display device used for a portable information device, a mobile telephone, and the like and an illumination device such as a frontlight unit or a backlight unit to illuminate the display element.

2. Description of the Related Art

In recent years, most of display devices used for a mobile telephone, a mobile computer, and the like are liquid crystal display devices capable of obtaining a high-definition color image with reduced power consumption. A liquid crystal element used for the liquid crystal display devices is a non-self light emission type, so the liquid crystal element is illuminated by an illuminating device using a high-intensity white LED as a light source.

In particular, a reflection type liquid crystal display device which has a large aperture and is bright or a liquid crystal display device of a double side visible type which can display image information on both front and rear screens is used for the mobile telephone. The white LED used to illuminate a display element of each of the liquid crystal display devices has a structure in which a resin into which a yellow phosphor is dispersed is provided immediately in front of a light emitting surface of a blue LED made of InGaN, GaN, or the like. According to the structure, yellow light can be mixed with original blue light to obtain white light. An yttrium aluminum garnet (YAG) phosphor in which YAG is doped with a rare-earth element has been widely known as a phosphor for converting the blue light into the yellow light. A method of producing white light by additive mixing of blue, red, and green using a mixture of red and green light emitting phosphors instead of the YAG phosphor has been known (see, for example, JP 10-163535 A). A chalcogenide phosphor or a nitride phosphor which is doped with a rare-earth element has been widely known as a phosphor for converting the blue light into green light or red light with relatively high efficiency. There has been disclosed an LED display device in which a plurality of light emitting elements, each of which emits light having a wavelength equal to or shorter than the wavelength of the blue light, are arranged on a printed circuit board which has an arbitrary shape and an arbitrary area and includes circuits formed therein and the respective light emitting elements are coated with a translucent resin containing a wavelength conversion material (see, for example, JP 11-121802 A).

However, in the case of additive mixing of two colors using the blue LED and the YAG phosphor (i.e., pseudo white LED), the amount of light component having a wavelength region of 600 nm or more is small. Therefore, an LCD module having high color reproducibility cannot be realized. In general, when the pseudo white LED is used as a light source, it is very difficult for a current color filter to exceed an NTSC ratio of 100%. As described in JP 10-163535 A, when a structure in which two kinds of phosphors for converting blue light into green light and red light based on blue excitation are dropped on the light emitting surface of the blue LED is used, additive mixing of three colors (i.e., three-wavelength white LED) is possible, so the LCD module having high color reproducibility can be realized. However, the chalcogenide phosphor doped with the rare-earth element causes a chemical reaction with a reflective film included in the LED, so a problem in which a reflection characteristic deteriorates occurs in many cases. When the white light is to be produced based on blue excitation using the mixture of the green phosphor and the red phosphor, a nitride phosphor or a chalcogenide phosphor may be used as the red phosphor. An excitation wavelength of each of the phosphors includes that of the green light emitted from the green phosphor, so there is a problem in that intensity efficiency is low.

SUMMARY OF THE INVENTION

Therefore, an object of the present invention is to realize an illumination device in which high color reproducibility is obtained by additive mixing of three colors and intensity efficiency and reliability are high. That is, an illumination device according to the present invention has a structure in which a first color conversion element for converting blue light into red light is disposed on an optical path between a second color conversion element for converting blue light into green light and a blue light emitting element and separated from the second color conversion element. According to the structure, the blue light emitted from the blue light emitting element and the red light obtained by the first color conversion element are mixed to obtain violet light. Then, the violet light is mixed with green light obtained by the second color conversion element based on blue excitation to produce white light. The light from the blue light emitting element is converted into the white light by such a conversion order, so light emitted from a green phosphor included in the second color conversion element does not reach a red phosphor included in the first color conversion element. Therefore, light emission efficiency of the illumination device is improved. The blue light emitting element is completely separated from the green phosphor, so the green phosphor does not scientifically influence the blue light emitting element or is not influenced by the blue light emitting element. Therefore, reliability is improved.

A display device according to the present invention includes the illumination device having any structure as described above and a non-self light emission display element provided on an irradiation surface side of the illumination device.

Alternatively, a display device according to the present invention includes a blue light emitting element, a non-self light emission display element, a light guide member for receiving incident light from the blue light emitting element and exiting the received light from a light exit surface to the non-self light emission display element, a red light emitting phosphor provided on an optical path between the blue light emitting element and the non-self light emission display element, and a green light emitting phosphor provided on an optical path between the red light emitting phosphor and the non-self light emission display element.

Alternatively, a display device according to the present invention is a display device for illuminating a non-self light emission display element with light emitted from a blue light emitting element. The display device includes a first color conversion element for converting light into red light based on blue excitation and a second color conversion element for converting light into green light based on blue excitation. The first color conversion element and the second color conversion element are disposed on an optical path between the blue light emitting element and the non-self light emission display element and separated from each other.

DETAILED DESCRIPTION OF THE PREFERRED EMBODIMENTS

Figure 1:
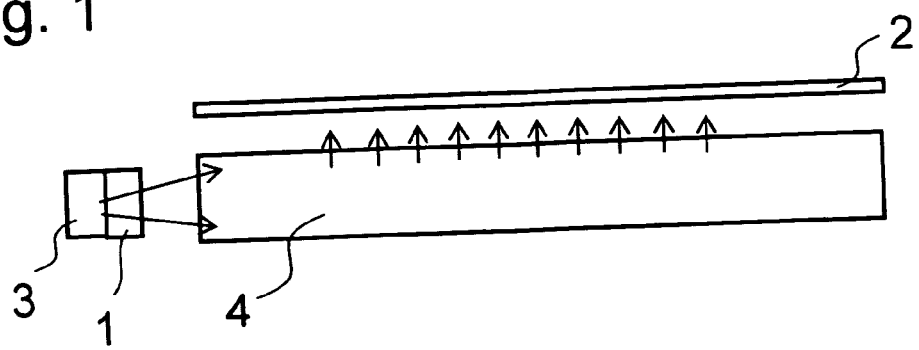
FIG. 1 is a schematic cross sectional view showing a structure of an illumination device according to the present invention.

An illumination device according to the present invention includes a blue light emitting element, a first color conversion element for converting light into red light based on blue excitation, and a second color conversion element for converting light into green light based on blue excitation. The first color conversion element is disposed on an optical path between the blue light emitting element and the second color conversion element and separated from the second color conversion element. This structure is schematically shown in FIG. 1. That is, a first color conversion element 1 and a second color conversion element 2 are disposed on an optical path of the illumination device and separated from each other. In FIG. 1, a light guide member 4 for guiding light from a blue light emitting element 3 to exit the light from a light exit surface is provided between the first color conversion element 1 and the second color conversion element 2. The first color conversion element 1 is provided between the blue light emitting element 3 and the light guide member 4. With this structure, blue light emitted from the blue light emitting element 3 is mixed with red light obtained by the first color conversion element 1 and then mixed with green light obtained by the second color conversion element to produce white light. The white light is produced by such a conversion order, so light emitted from a green phosphor included in the second color conversion element does not become excitation light for a red phosphor included in the first color conversion element. Therefore, light emission efficiency of the illumination device is improved. The blue light emitting element is completely separated from the green phosphor included in the second color conversion element, so the green phosphor does not scientifically affect the blue light emitting element and is not affected thereby. Therefore, a temperature-intensity characteristic and reliability are improved.

The illumination device according to the present invention further includes the light guide member for guiding the light emitted from the blue light emitting element to the light exit surface. The first cover conversion element includes the red phosphor which emits the red light when it is excited by the blue light. The second color conversion material includes the green phosphor which emits the green light when it is excited by the blue light. It is only necessary to separate the green phosphor from the blue light emitting element and the red phosphor. That is, the green phosphor may be present in the light guide member or provided on the light exit surface side of the light guide member. Examples in the latter case can include a structure in which the green phosphor is present in a resin or a film which is provided on the light exit surface side of the light guide member and a structure in which the green phosphor is present in a resin formed on a film provided on the light exit surface side of the light guide member.

When the second color conversion element is mixed with transparent beads, a red light component easily passes therethrough, so there is an effect that an intensity increases. A resin layer containing transparent diffused beads of acrylic or silica may be provided on a side closer to an observer than the second color conversion element.

The red phosphor may be provided in a resin located between the blue light emitting element and the light guide member or provided in a resin for potting the blue light emitting element.

The second color conversion element is mixed with a third phosphor excited with blue light at a weight ratio of 30% or less to the green phosphor. A second red phosphor for converting light into red light based on blue excitation, a phosphor for converting light into orange light based on blue excitation, or a phosphor for converting light into yellow light based on blue excitation can be used as the third phosphor. The second red phosphor may include the same substance as that of the red phosphor used for the first color conversion element.

The second color conversion element having any structure as described above may be located between two non-permeable transparent substrates.

Alternatively, the illumination device according to the present invention includes a blue light emitting element, a first color conversion element for converting light into red light based on blue excitation, and a second color conversion element for converting light into green light based on blue excitation. The first color conversion element and the second color conversion element are separated from each other. The first color conversion element includes a red light emitting phosphor for converting the light into the red light based on blue excitation. The second color conversion element includes a green light emitting phosphor for converting the light into the green light based on blue excitation. The second color conversion element further includes a third phosphor which is excited with the blue light and mixed into the second color conversion element at a weight ratio of the third phosphor to the green light emitting phosphor which is equal to or smaller than 30%. Examples of the third phosphor can include a red light emitting phosphor for converting light into red light based on blue excitation, a color phosphor for converting light into orange light based on blue excitation, and a color phosphor for converting light into yellow light based on blue excitation. When the third phosphor is the red light emitting phosphor, the third phosphor may include the same substance as that of the red light emitting phosphor included in the first color conversion element or a substance different therefrom.

A display device according to the present invention includes the illumination device according to any structure as described above and a non-self light emission display element provided on an irradiation surface side of the illumination device.

Alternatively, the display device according to the present invention is a display device for illuminating a non-self light emission display element with light emitted from a blue light emitting element. The display device includes a first color conversion element for converting light into red light based on blue excitation and a second color conversion element for converting light into green light based on blue excitation. The second color conversion element is disposed on an optical path between the first color conversion element and the non-self light emission display element and separated from the first color conversion element. According to the display device having the structure, an intensity and color reproducibility are high and an excellent display quality is obtained.

When the display device includes a color filter for color display, it is desirable that a green colored portion of the color filter have a characteristic in which transmittance of light of 470 nm or less is equal to or lower than 20% of transmittance of light having the vicinity of 535 nm. Alternatively, it is desirable that the green colored portion of the color filter have a characteristic in which transmittance of light of 600 nm or more is equal to or lower than 20% of the transmittance of the light having the vicinity of 535 nm. When both the characteristics are provided, a green purity is further improved.

The first color conversion element includes a red phosphor for converting the light into the red light based on blue excitation. The second color conversion element includes a green phosphor for converting the light into the green light based on blue excitation. A third phosphor which is excited with blue light to emit light is mixed into the second color conversion element at a weight ratio of the third phosphor to the green phosphor which is equal to or smaller than 30%.

Alternatively, the display device according to the present invention further includes a light guide member for guiding the light emitted from the blue light emitting element to cause surface light emission. The first color conversion element includes a red phosphor for emitting the red light in response to excitation with blue light. The second color conversion element includes a green phosphor for emitting the green light in response to excitation with the blue light. The green phosphor is provided the light guide member.

Alternatively, the display device according to the present invention further includes a light guide member for guiding the light emitted from the blue light emitting element to a light exit surface. The first color conversion element includes a red phosphor for emitting the red light in response to excitation with blue light. The second color conversion element includes a green phosphor for emitting the green light in response to excitation with the blue light and is provided on a light exit surface side of the light guide member.

Transparent beads are mixed into the second color conversion element. Therefore, transmittance of a red light component increases, so there is an effect that color reproducibility improves and an intensity increases.

Hereinafter, embodiments of the present invention will be described with reference to the accompanying drawings.

Embodiment 1

Figure 2:
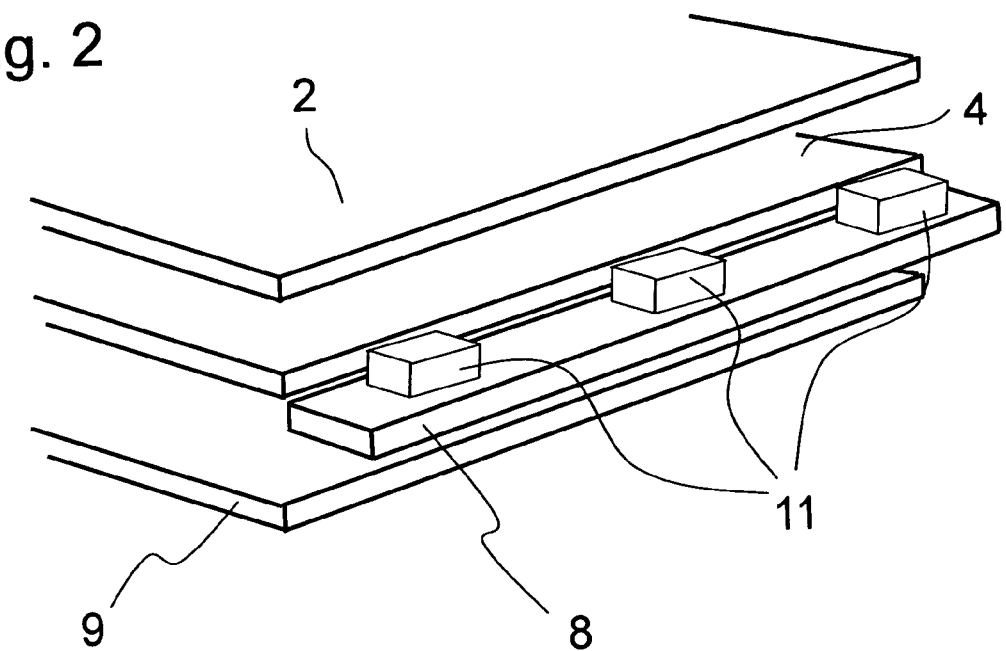
FIG. 2 is a schematic perspective view showing the structure of the illumination device according to the present invention.

An illumination device according to this embodiment will be described with reference to the accompanying drawings. FIG. 2 is a schematic external view showing an outline of the illumination device according to this embodiment. In the illumination device, light from each of light emitting diode packages 11 is incident on the light guide member 4 and light exited from the light exit surface of the light guide member 4 is incident on the second color conversion element 2. A reflecting plate 9 is disposed on a side of the light guide member 4 which is opposed to the light exit surface thereof. Each of the light emitting diode packages 11 includes a blue LED element potted with a resin into which red phosphor particles are dispersed. The resin containing the red phosphor particles corresponds to the first color conversion element. A predetermined number of light emitting diode packages 11 which are set according to an irradiation area are mounted on a circuit board 8. An example of a material of the light guide member 4 can include polycarbonate or acrylic.

According to such a structure, a part of light (blue light) emitted from the blue LED element is converted into red light and the remaining part thereof is incident on the light guide member 4 in a state of the blue light. That is, each of the light emitting diode packages 11 emits light (violet light) having a spectrum in which there is a peak at each of a wavelength of 450 nm to 480 nm and a wavelength of 600 nm to 680 nm. The violet light is incident on the light guide member 4. The violet light incident on the light guide member 4 is repeatedly reflected and refracted between the light guide member 4 and the reflecting plate 9. Then, the violet light is uniformly exited from the light exit surface of the light guide member 4 and reaches the second color conversion element containing green phosphor particles. Parts of the light incident on the second color conversion element pass therethrough without any changes (in a state of the blue light and the red light). In addition, a part of the light is converted into green light by the green phosphor particles and passes through the second color conversion element. At this time, many red light components which reach the green phosphor particles are reflected thereby. Therefore, the violet light and the green light which pass through the second color conversion element are mixed to obtain white light. That is, when the light exited from the light exit surface of the light guide member 4 pass through the second color conversion element 2, additive mixing is caused to produce the while light.

Hereinafter, the light emitting diode package, the second color conversion element, and the reflecting plate, each of which is a constituent element in this embodiment, will be described in more detail. The illumination device as shown in FIG. 2 can be manufactured by either one of the constituent elements alone or a combination thereof.

(With Respect to Reflecting Plate)

In a conventional illumination device, a reflecting plate 9 in which a silver layer or an aluminum layer is provided on a transparent film is used. However, silver has the property of absorbing blue light and aluminum has no high reflective property. Therefore, the use of such a reflecting plate as the reflecting plate 9 in this embodiment results in occurrence of a reduction in intensity. In order to avoid this, it is preferable to use a reflecting sheet having high reflectance in a visible light range. For example, it is preferable to use a white PET film or a multilayer film made of polyester resin having high reflectance on a blue light component. Thus, a reflection loss is small, so a screen intensity can be significantly improved by the effective use of a light source. An commercial item suitable for such an application includes an ESR reflective film which is developed as a lower reflective sheet of a light guide plate of a backlight unit and produced by Sumitomo 3M Limited.

(With Respect to Light Emitting Diode Package)

Figure 3:
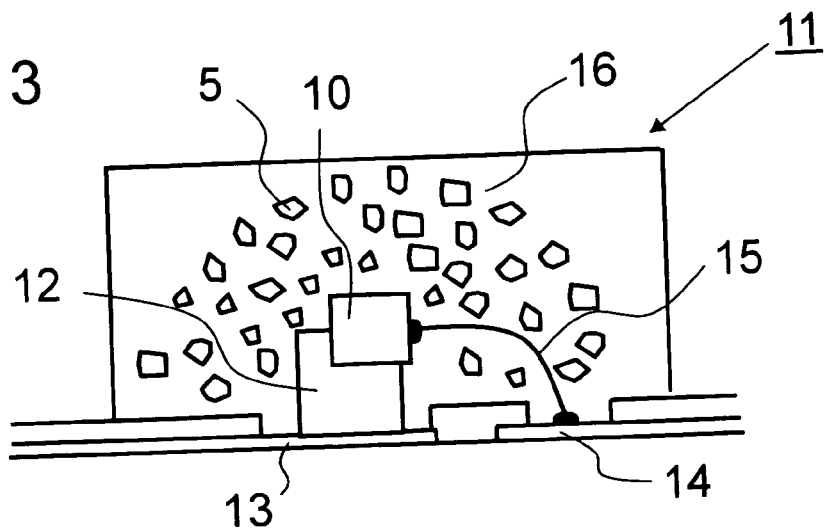
FIG. 3 is a schematic cross sectional view showing a structure of a light source used in the present invention.

FIG. 3 is a schematic cross sectional view showing a structure of the light emitting diode package 11. As shown in FIG. 3, the light emitting diode package 11 has a structure in which a blue LED element 10 is potted with a resin 16 into which red phosphor particles 5 are dispersed. A first electrode terminal 13 and a second electrode terminal 14 which are used to drive the blue LED element 10 are formed on the circuit board 8. The blue LED element 10 made of InGaN or GaN is electrically connected with a conductive base 12 through a conductive paste. The conductive base 12 is used, for example, to increase the degree of electrical connection between the blue LED element 10 and the first electrical terminal 13, improve thermal conductivity, or adjust a height from the circuit board 8. In an environment in which those conditions are satisfied, the conductive base 12 is not necessarily provided. Two electrodes for current injection (not shown) are formed in the blue LED element 10. One of the two electrodes is electrically connected with the first electrical terminal 13 through the conductive base 12 and the other thereof is electrically connected with the second electrode terminal 14 through a wire 15. When the conductive base 12 is not used, it is only necessary that both the two electrodes be electrically connected with the corresponding electrode terminals through the wires 15. For example, a gold wire for normal wire bonding can be used as the wire 15. The circuit board 8 includes a protective film such as an insulating film which is provided except for the electrode terminals which are electrical connection portions. A flexible printed circuit board or a glass epoxy board can be used as the circuit board 8.

The blue LED element 10, the entire conductive base 12, and a part of or the entire wire 15 are coated with a resin 16 which is translucent. The resin 16 contains red phosphor particles 8 mixed at a predetermined concentration. It is desirable to use a material resistant to the penetration of moisture (hereinafter, referred to as non-permeable material) as the resin. To be specific, a polymer material such as a silicon resin, a cycloolefin resin, or a fluorine resin can be used. Any one selected from those resins may be used or a hybrid composed of a plurality of resins may be used. The non-permeable material is not necessarily transparent and thus needs to be translucent, so an epoxy material is also widely used.

Chalcogenide compound phosphor particles can be used as the red phosphor particles 5. Alternatively, a phosphor material which is composed of a nitride and a rare-earth dopant and a phosphor material which is composed of a sulfide and a rare-earth dopant are suitable. In particular, each of the phosphor material which is composed of the sulfide such as CaS or SrS and the rare-earth dopant and the phosphor material which is composed of the nitride and the rare-earth dopant has high optical conversion efficiency. When the red phosphor particles are coated with the non-permeable material, the reliability of the diode package is improved. $SiO_2$, a silicon resin, a cycloolefin resin, a fluorine resin, or an epoxy resin can be used as the non-permeable material. In particular, the sulfide phosphor may react with moisture to generate a hydrogen sulfide, so the reflective film included in the LED causes chemical reactions to significantly deteriorate an intensity characteristic. Therefore, when the sulfide phosphor is to be used, it is necessary to coat the phosphor particles themselves with a transparent non-permeable material. When the nitride phosphor is to be used, coating (coating with the non-permeable material) may be unnecessary.

As shown in FIG. 3, when the blue LED element 10 is coated with the resin 16 containing the red phosphor particles 5 mixed at a predetermined ratio, blue light from the blue LED element 10 made of InGaN or GaN and red light generated by wavelength conversion on the blue light are subjected to additive color mixing, so it is possible to obtain a light emission color having target chromaticity. A color reproducibility region caused by the light emission color can be arbitrarily controlled by adjusting a mixture concentration of the red phosphor particles 5, an average diameter of the respective phosphor particles, and an intensity of the blue light for irradiation. For example, when a mixture weight concentration of the red phosphor particles 5 is approximately 50% in a case where a thickness of the resin 16 is 60 µm to 70 µm, light (violet light) having chromaticity coordinates of approximately x=0.35 and y=0.18 is obtained. In this case, when an intensity of the blue light increases, both "x" and "y" becomes smaller. On the other hand, when the intensity of the blue light reduces, both "x" and "y" becomes larger. A variation in each of the chromaticity coordinate is approximately ±0.02 at most, so the influence of the variation on the light emission color is small. Because the mixture concentration is high, when the resin 16 is further mixed with transparent dispersed beads of silica or the like, the dispersibility of the phosphor particles is improved, thereby increasing light emission efficiency.

(With Respect to Second Color Conversion Element)

Next, some examples of the structure of the second color conversion element containing the green phosphor particles will be described.

Figure 4:
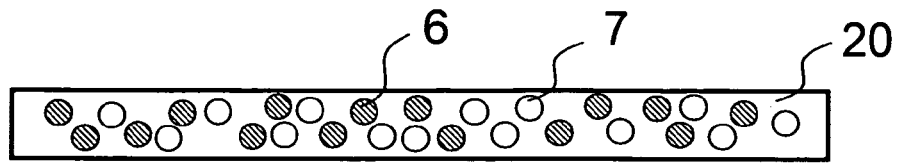
FIG. 4 is a schematic view showing a structure of an example of a second color conversion element.

FIG. 4 shows a color conversion element formed by dispersing green phosphor particles 6 and transparent beads 7 into a resin 20. Therefore, when the transparent beads are dispersed into the second color conversion element, the transmittance of the red light component increases, so there is an effect that the intensity increases.

This reason will be briefly described. When mixture light of red and blue which is incident on the second color conversion element from the light guide member collides with the green phosphor particles 6 of the second color conversion element, a part of a blue light component thereof becomes excitation light and exits as a green light component. However, of the red light component, a major part of light which reaches the green phosphor particles 6 is reflected by the green phosphor particles 6 or absorbed in interfaces. The reflected light is to be repeatedly reflected on the reflecting plate 9 and by surrounding phosphor particles. Of course, a part of the reflected red light component finally passes through the resin 20. As described above, a major part of the red light which reaches the green phosphor particles 6 attenuates and a part of the red light exits. Further, as described above, when the resin 20 is mixed with substances having high transmittance to visible light, such as the transparent beads 7, in addition to the green phosphor particles 6, a region in which only the green phosphor particles 6 are concentrated stochastically disappears. Therefore, a red light component which passes through the transparent beads 7 and exits is reserved. Thus, a probability that the red light component exits becomes higher, causing an increase in intensity. Transparent fine particles of acrylic, silica, or the like are suitable as the transparent beads 7.

Figure 5:
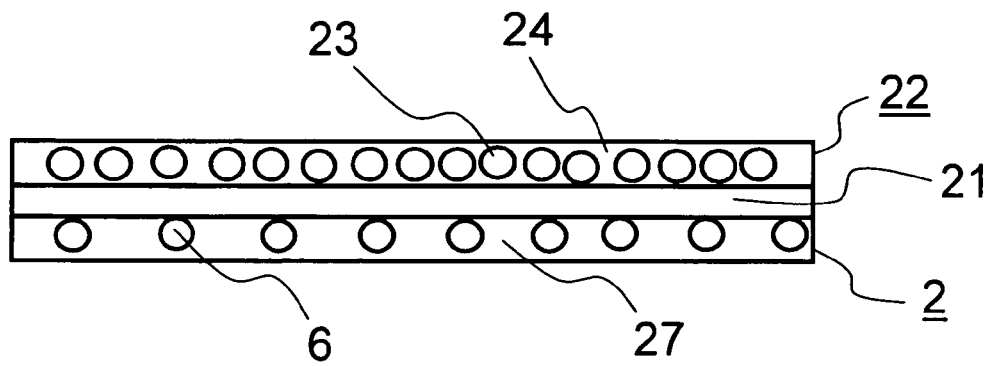
FIG. 5 is a schematic cross sectional view showing a structure of a green light emitting and diffusing film used in Embodiment 1.

FIG. 5 is a schematic cross sectional view showing a structure including the second color conversion element 2 and a diffusion layer 22. The second color conversion element 2 has a structure in which the green phosphor particles 6 are dispersed into a transparent resin 27. The diffusion layer 22 is provided on a side closer to an observer than the second color conversion element 2. In the structure shown in FIG. 5, the diffusion layer 22 and the transparent resin 27 are laminated to sandwich a transparent substrate 21 made of PET, polycarbonate, acrylic, ZEONOR, or the like. It is preferable that the transparent substrate be a non-permeable transparent substrate. The diffusion layer 22 has a structure in which transparent diffused beads 23 are dispersed into a resin 24. The resin 24 into which the transparent diffused beads 23 of acrylic, silica, or the like are dispersed is applied onto an upper surface of the transparent substrate 21 and then cured. On the other hand, the transparent resin 27 into which the green phosphor particles 6 are dispersed is applied onto a lower surface of the transparent substrate 21 and then cured. Therefore, the structure shown in FIG. 5 can be manufactured. Exited light is diffused by the transparent diffused beads 23, so an illumination device having high uniformity of a surface intensity can be realized. The same material as that of the transparent beads 7 may be used for the transparent diffused beads 23.

Figure 6:
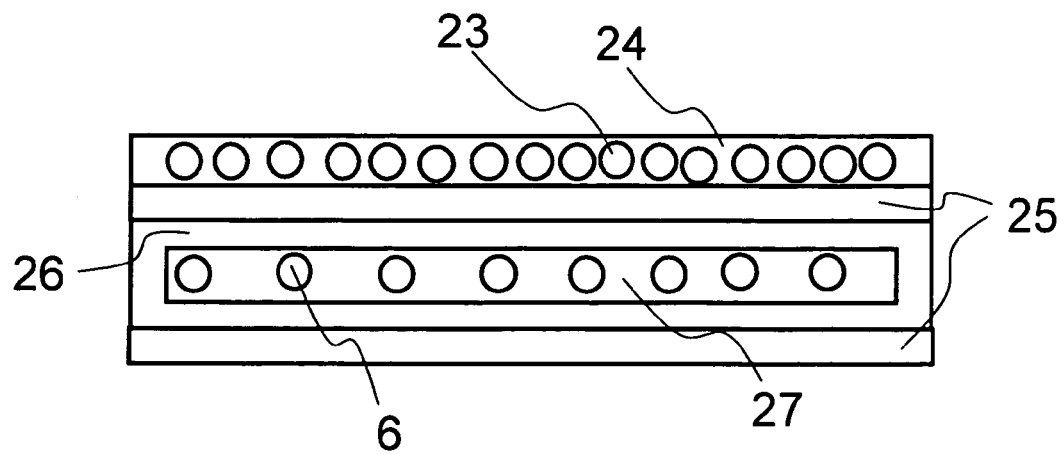
FIG. 6 is a schematic cross sectional view showing another structure of the green light emitting and diffusing film used in Embodiment 1.

FIG. 6 is a schematic cross sectional view showing a structure in which the transparent resin 27 into which the green phosphor particles 6 are dispersed is sandwiched between non-permeable transparent substrates 25, in each of which a transparent film is subjected to non-permeate processing. A transparent film made of PET, polycarbonate, acrylic, or the like is used as the transparent film. In the non-permeate processing, a barrier layer made of $SnO_2$, $SiO_2$, or the like is provided for the transparent film. A layer structure of the barrier layer is not limited to a single layer. When a plurality of layers are formed, an effect on a non-permeable surface is higher. A transparent bonding layer 26 which is, for example, thermoplastic is applied to one of the non-permeable transparent substrates 25 in advance. The transparent resin 27 into which the green phosphor particles 6 are dispersed is applied onto the transparent bonding layer 26 and then cured. The transparent bonding layer 26 may be an adhesive layer. When end surfaces of the transparent resin 27 in to which the green phosphor particles 6 are dispersed are to be prevented from being in contact with an external air layer, it is necessary that an additional transparent bonding layer 26 be provided to cover the end surfaces of the transparent resin 27. Therefore, it is preferable that an applying method be a mask printing method such as a screen printing method. The other of the non-permeable transparent substrates 25 is laminated on the additional transparent bonding layer 26. With such a structure, the phosphor particles can be effectively protected from moisture. Thus, the second color conversion element is prevented from deteriorating, so the reliability is improved. The transparent diffused beads 23 of silica or acrylic, each of which has a size of approximately 5 μm to 30 μm, are dispersed into the resin 24. Then, the resin 24 is provided on a surface of one of the non-permeable transparent substrates 25. When the resin 24 is not provided, apart of light from the transparent resin is reflected on an interface between the non-permeable transparent substrate and air by a refraction index difference therebetween. When the resin 24 into which the transparent diffused beads 23 are dispersed is provided, such reflection can be prevented, with the result that light use efficiency improves. In addition, the diffuseness of light improves, so there is also an effect that a view angle is widened and in-plane unevenness is covered.

In this embodiment, the green phosphor particles 6 are dispersed into the resin. Even when the green phosphor particles 6 are kneaded into the transparent substrate 21, applied to or kneaded into the light guide member 4, or applied to a light incident surface of a display element of an LCD panel or the like which is an object to be illuminated, the same effect is obtained.

A phosphor material composed of II-group metal thiogallate and a rare-earth dopant, a phosphor material composed of an oxide and a rare-earth dopant, a phosphor material composed of Sr-SION and a rare-earth dopant, or the like can be used as a material of the green phosphor particles 6. That is, a phosphor having intensity efficiency equal to or larger than that of a YAG phosphor is suitable. When the green phosphor particles 6 are coated with a transparent non-permeable material such as $SiO_2$, higher reliability can be obtained.

Figure 7:
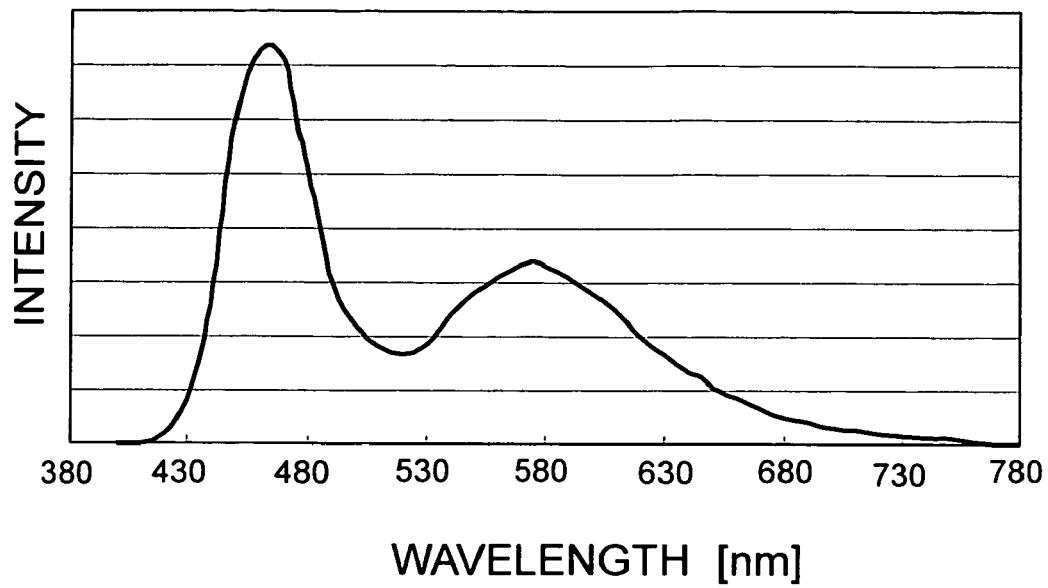
FIG. 7 is a graph showing a spectrum of a conventional illumination device.
Figure 8:
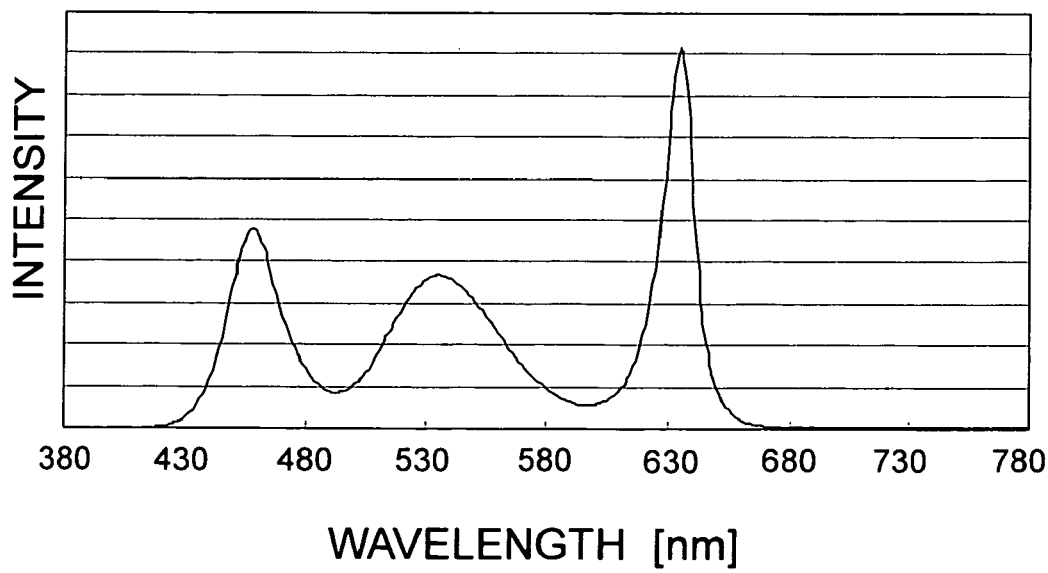
FIG. 8 is a graph showing a spectrum of the illumination device according to Embodiment 1 of the present invention.

The amount of addition of the green phosphor particles is set to approximately 0.2 mg/cm$^2$. Then, when the second color conversion element containing the green phosphor particles is combined with the light emitting diode package 11 having the structure shown in FIG. 3, white light having chromaticity coordinates of approximately x=0.31 and y=0.31 can be obtained. FIG. 7 shows a light emission spectrum of a conventional illumination device using a two-wavelength type pseudo white LED as a light emitting source. A wavelength region of a red light component is 600 nm or more. An intensity of the red light component is extremely smaller than that of each of a blue light component and a green light component. FIG. 8 shows a light emission spectrum of the illumination device having the above-mentioned structure. It is apparent that an intensity in a red light emission region of 600 nm or more is much higher than the intensity of the red light component as shown in FIG. 7.

Various kinds of color filters and various kinds of liquid crystal materials are used for a liquid crystal display panel illuminated with the illumination device. To be exact, it is necessary to prepare illumination devices of different tones according to the color filters and the liquid crystal materials. However, in view of the cost reduced owing to mass production and the risk of stock, it is not preferable to prepare several kinds of light emitting diode packages, each of which is the light emitting diode packages 11. Therefore, not only the green phosphor particles 6 but also a small amount of red phosphor particles are added to the second color conversion element 2 and mixed therewith, so a tone is allowed to be shifted to a red side. When a tone of the light emitting diode packages 11 for violet light emission is shifted to a blue side in advance, suitable tones of all kinds of LCD panels are easily obtained by only tone adjustment of the second color conversion element 2. At this time, for example, when the red phosphor particles are made of a phosphor material which is composed of CaS and a rare-earth dopant and the green phosphor particles 6 are made of a phosphor material which is composed of II-group metal thiogallate and a rare-earth dopant, a weight ratio of the amount of red phosphor particles mixed into the second color conversion element to the amount of green phosphor particles is set to approximately 30%. As a result, it is determined that the amount of shifts substantially expressed by the following expressions (Expressions 1 and 2) are obtained on xy-chromaticity coordinates.

$$\Delta x=+0.04 \qquad \text{(Expression 1)}$$

$\Delta y = -0.02$  (Expression 2)

Thus, when the weight ratio of the red phosphor particles to the green phosphor particles is controlled in a range of 0% to 30%, the above-mentioned illumination device can be applied to most of LCD panels currently distributed in the market.

In view of compatibility such as dispersibility, with a sealing resin, there is a case where it is difficult that a small amount of red phosphor particles 5 added to the light emitting diode package 11 is added to the second color conversion element without any processing, depending on a phosphor material. In such the case, the same composition as that of the red phosphor particles 5 is not necessarily employed. For example, it is also possible that a phosphor material composed of a nitride and a rare-earth dopant be used for the red phosphor particles 5 added to the light emitting diode package 11 and a phosphor material composed of CaS or SrS and a rare-earth dopant be used for a small amount of red phosphor particles added to the second color conversion element. In particular, SrS has a light emission wavelength peak at the vicinity of 600 nm and is orange rather than red. Therefore, it can be said that SrS is suitable for an LCD panel which has a high visibility characteristic and requires a high intensity. When a phosphor material for yellow light emission, such as a YAG phosphor, is used as a phosphor material added in minute amounts, a color shift to a yellow side can be controlled.

Embodiment 2

Figure 9:
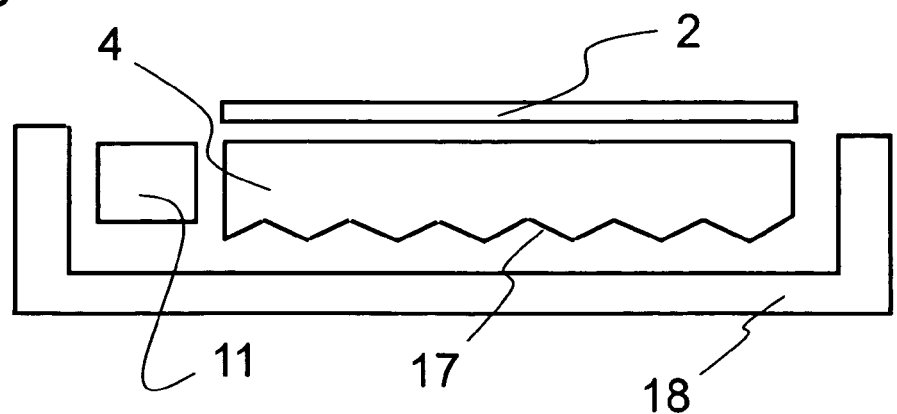
FIG. 9 is a schematic cross sectional view showing the entire structure of an illumination device according to Embodiment 2 of the present invention.

FIG. 9 is a schematic cross sectional view showing the entire structure of an illumination device according to this embodiment. A point different from the structure of the illumination device according to Embodiment 1 is that a prism instead of the reflecting plate is provided on a rear surface of the light guide member 4. The light emitting diode packages 11 having the structure shown in FIG. 3 are turned on to allow light to enter the light guide member 4. The incident light is uniformly exited from a light exit surface of the light guide member 4 which is an upper portion thereof in the cross sectional view of FIG. 10 by a prism 17 designed with an optimum angle and an optimum height. Then, the light passes through the second color conversion element 2 to convert a part of blue light into green light. Therefore, white light can be obtained from blue light, red light, and green light by additive mixing of three colors. The light guide member 4 and the light emitting diode packages 11 are stored in a frame 18. Other structures can be obtained as appropriate using the respective constituent elements described in Embodiment 1.

Embodiment 3

Figure 10:
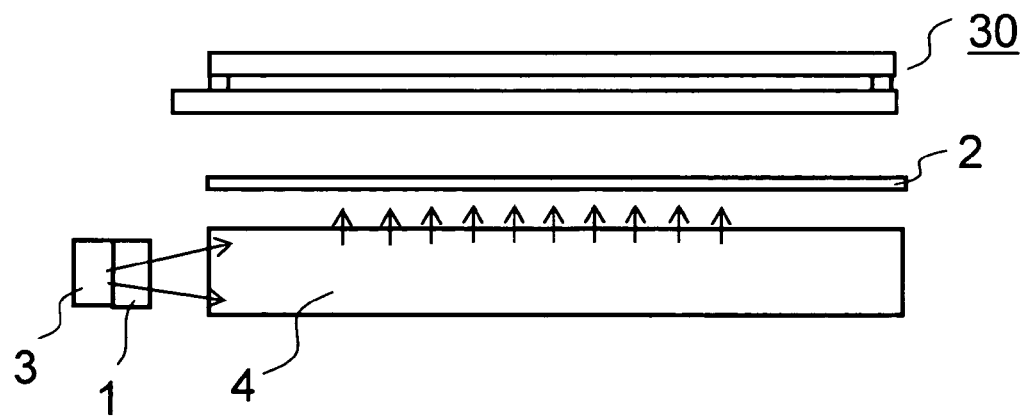
FIG. 10 is a schematic cross sectional view showing a structure of a liquid crystal display device according to Embodiment 3 of the present invention.

Next, a liquid crystal display device using a liquid crystal display panel as a non-self light emission display element will be described. FIG. 10 is a schematic cross sectional view showing a structure of the liquid crystal display device. A liquid crystal display panel 30 is located on the light emitting surface of the illumination device shown in FIG. 1. The description overlapped with that in FIG. 1 is omitted here. The liquid crystal display panel 30 includes a color filter. In the case of a display device capable of performing color display, it is necessary to perform tuning on colored portions of the color filter based on a spectrum of a light source. In particular, it is important to adjust a green colored portion.

Figure 11:
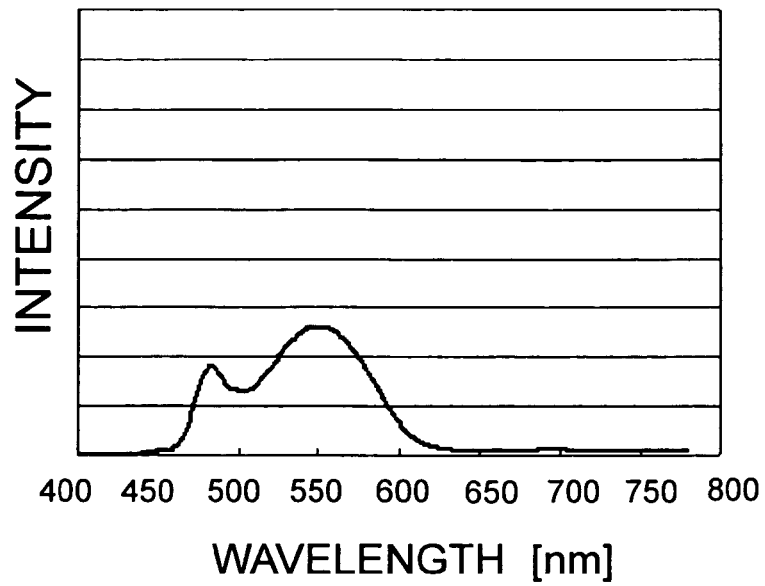
FIG. 11 is a graph showing a light transmission characteristic of light passing through a green colored layer of a color filter suitable for a conventional pseudo white LED made of a YAG phosphor.
Figure 12:
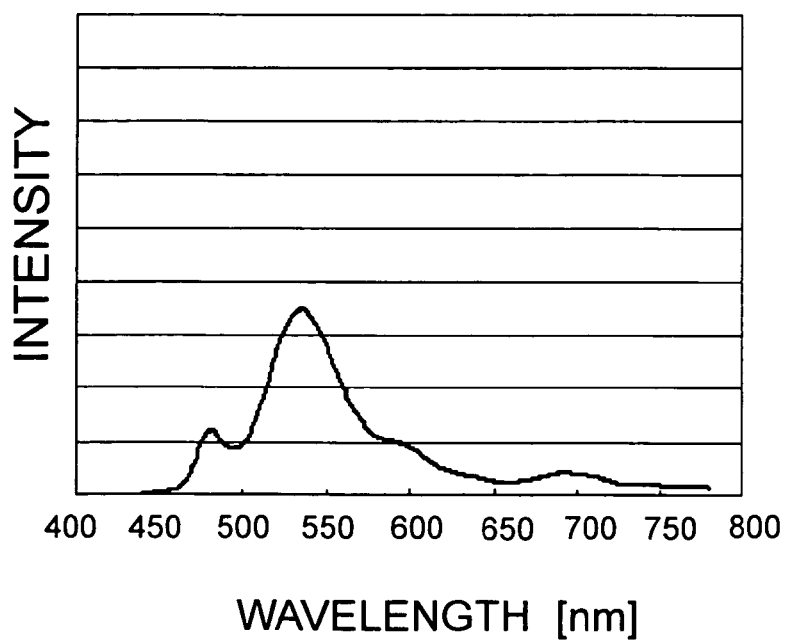
FIG. 12 is a graph showing a light transmission characteristic of light passing through the green colored layer in the case where the green colored layer used in FIG. 11 is combined with the illumination device according to the present invention.
Figure 13:
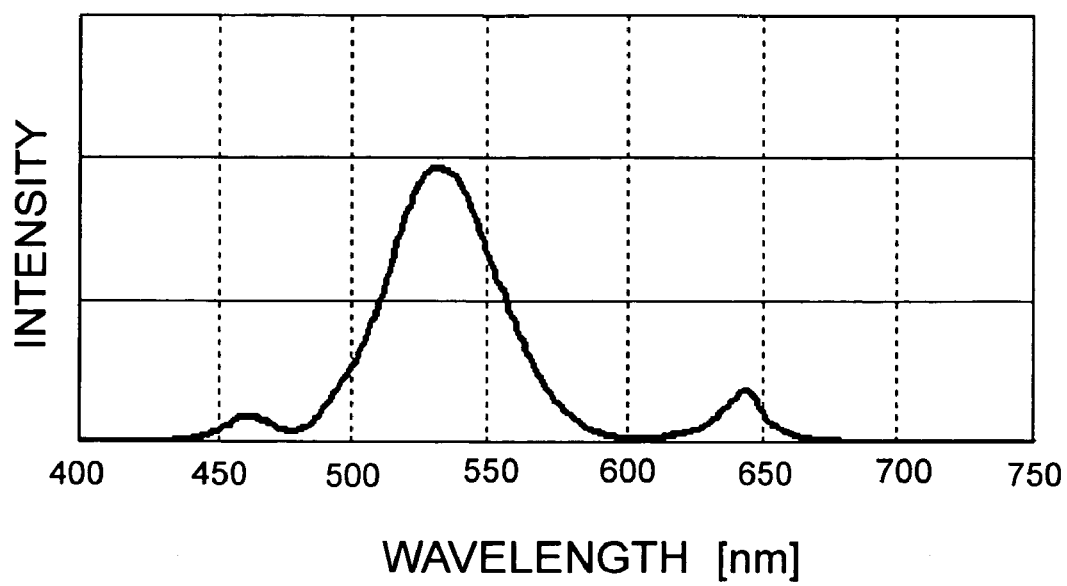
FIG. 13 is a graph showing a light transmission characteristic of light passing through a green colored layer of a color filter applied to the illumination device according to the present invention.

When a pseudo white LED made of a YAG phosphor is used as a conventional light source, it is necessary to manufacture the color filter provided in the liquid crystal display panel based on the light emission spectrum (FIG. 7) of the pseudo white LED. Green is formed by additive mixing of yellow and blue. That is, a green colored layer of the color filter requires a characteristic for transmitting light of a yellow wavelength region and light of a blue wavelength region. FIG. 11 shows a light transmission characteristic of light passing through the green colored layer of the color filter in a case where the pseudo white LED which is made of the YAG phosphor and serves as the conventional light source and the color filter suitable for the pseudo white LED are used. FIG. 12 shows a light transmission characteristic of light passing through the green colored layer in a case where the green colored layer is combined with the illumination device according to the present invention. As is apparent from FIG. 12, in a case of such a combination, the blue light is mixed with green light of high purity, with the result that a reduction in color purity occurs. It is preferable that the green colored layer of the liquid crystal display panel combined with the illumination device according to the present invention have a characteristic in which transmittance of blue light of 470 nm or less and transmittance of red light of 600 nm or more are minimized. When the color filter including the green colored layer having such a characteristic is used, liquid crystal display device having a significantly high color purity can be realized. FIG. 13 shows a spectral characteristic obtained from the above-mentioned structure. An effect in which a color purity is increased improves as the transmittance of the blue light and the transmittance of the red light become lower. It is desirable that each target transmittance be made equal to or lower than 20% of transmittance of green light having the vicinity of 535 nm.

According to the illumination device of the present invention, the green light emitted from the second color conversion element does not become execution light for the first color conversion element and the white light can be obtained by additive mixing of three colors of blue, red, and green. Therefore, an illumination device having high light emission efficiency can be realized. The LED element and the second color conversion element are separated from each other, so a reflection characteristic of an inner portion of the LED package does not deteriorate. Therefore, a long-life illumination device can be realized. When the illumination device according to the present invention is combined with the LCD panel, a liquid crystal display device having high color reproducibility, a high intensity, and a long life can be realized.

What is claimed is:

1. An illumination device, comprising:
    a blue light emitting element that emits blue light;
    a light guide member that guides blue light emitted from the blue light emitting element to a light exit surface of the light guide member;
    a first color conversion element including a red phosphor that emits red light in response to excitation with the blue light, the first color conversion element being disposed on an optical path between the blue light emitting element and the light guide member; and
    a second color conversion element disposed on a light exit surface side of the light guide member and separated from the first color conversion element, the second color conversion element comprising a pair of non-permeable transparent substrates, a transparent bonding layer disposed between the non-permeable transparent substrates, a resin applied onto the transparent bonding layer, and a green phosphor dispersed in the resin for emitting green light in response to excitation with the blue light.

2. An illumination device according to claim 1; wherein the second color conversion element further comprises a diffusion layer containing transparent diffused beads dispersed therein, the diffusion layer being disposed on an upper surface of one of the non-permeable transparent substrates of the second color conversion element.

3. An illumination device according to claim 2; wherein the second color conversion element further comprises another phosphor that is excited with the blue light, a weight ratio of the another phosphor to the green phosphor being equal to or smaller than 30%.

4. An illumination device according to claim 2; wherein the green phosphor comprises a phosphor material composed of a II-group metal thiogallate and a rare-earth dopant.

5. An illumination device according to claim 1; wherein the second color conversion element further comprises another phosphor that is excited with the blue light, a weight ratio of the another phosphor to the green phosphor being equal to or smaller than 30%.

6. An illumination device according to claim 5; wherein the another phosphor is a red phosphor that converts light into red light in response to excitation with the blue light.

7. An illumination device according to claim 6; wherein the red phosphor of the second conversion element includes the same substance as that of the red phosphor of the first conversion element.

8. An illumination device according to claim 7; further comprising a multi-layer film disposed on a rear side of the light guide member and comprised of one of a polyester reflecting sheet and a white polyethylene terephthalate (PET) reflecting sheet.

9. An illumination device according to claim 6; further comprising a multi-layer film disposed on a rear side of the light guide member and comprised of one of a polyester reflecting sheet and a white polyethylene terephthalate (PET) reflecting sheet.

10. An illumination device according to claim 5; wherein the another phosphor is a color phosphor that converts light into orange light in response to excitation with the blue light.

11. An illumination device according to claim 10; further comprising a multi-layer film disposed on a rear side of the light guide member and comprised of one of a polyester reflecting sheet and a white polyethylene terephthalate (PET) reflecting sheet.

12. An illumination device according to claim 5; wherein the another phosphor is a color phosphor that converts light into yellow light in response to excitation with the blue light.

13. An illumination device according to claim 12; further comprising a multi-layer film disposed on a rear side of the light guide member and comprised of one of a polyester reflecting sheet and a white polyethylene terephthalate (PET) reflecting sheet.

14. An illumination device according to claim 5; further comprising a multi-layer film disposed on a rear side of the light guide member and comprised of one of a polyester reflecting sheet and a white polyethylene terephthalate (PET) reflecting sheet.

15. An illumination device according to claim 1; wherein the green phosphor comprises a phosphor material composed of a II-group metal thiogallate and a rare-earth dopant.

16. A display device for illuminating a non-self light emission display element with light emitted from a blue light emitting element, the display device comprising:
   a light guide member that guides blue light emitted from the blue light emitting element to a light exit surface of the light guide member;
   a first color conversion element including a red phosphor that emits red light in response to excitation with the blue light, the first color conversion element being disposed on an optical path between the blue light emitting element and the light guide member; and
   a second color conversion element disposed on a light exit surface side of the light guide member and separated from the first color conversion element, the second color conversion element comprising a pair of non-permeable transparent substrates, a transparent bonding layer disposed between the non-permeable transparent substrates, a resin applied onto the transparent bonding layer, and a green phosphor dispersed in the resin for emitting green light in response to excitation with the blue light.

17. A display device according to claim 16; further comprising a color filter for color display, the color filter including a green colored portion in which transmittance of light of 470 nm or less is equal to or lower than 20% of transmittance of light at a vicinity of 535 nm.

18. A display device according to claim 17; wherein the second color conversion element further comprises another phosphor that is excited with the blue light to emit light, a weight ratio of the another phosphor to the green phosphor being equal to or smaller than 30%.

19. A display device according to claim 16; further comprising a color filter for color display, the color filter including a green colored portion in which transmittance of light of 600 nm or more is equal to or lower than 20% of transmittance of light at a vicinity of 535 nm.

20. A display device according to claim 19; wherein the second color conversion element further comprises another phosphor that is excited with the blue light to emit light, a weight ratio of the another phosphor to the green phosphor being equal to or smaller than 30%.

21. A display device according to claim 16; wherein the second color conversion element further comprises a diffusion layer containing transparent diffused beads dispersed therein, the diffusion layer being disposed on an upper surface of one of the non-permeable transparent substrates of the second color conversion element.

22. A display device according to claim 16; wherein the second color conversion element further comprises another phosphor that is excited with the blue light to emit light, a weight ratio of the another phosphor to the green phosphor being equal to or smaller than 30%.

* * * * *